(12) United States Patent
Kim et al.

(10) Patent No.: US 6,194,954 B1
(45) Date of Patent: Feb. 27, 2001

(54) VOLTAGE CONTROLLED GENERATOR FOR SEMICONDUCTOR DEVICES

(75) Inventors: Saeng-Hwan Kim, Suwon; Kwang-Jin Lee; Ki-Chang Chun, both of Seoul, all of (KR)

(73) Assignee: Hyundai Electronics Industries Co., Ltd., Yicheon (KR)

( * ) Notice: Subject to any disclaimer, the term of this patent is extended or adjusted under 35 U.S.C. 154(b) by 0 days.

(21) Appl. No.: 09/221,990

(22) Filed: Dec. 29, 1998

(30) Foreign Application Priority Data

Dec. 31, 1997 (KR) ................................................ 97-82307
Dec. 31, 1997 (KR) ................................................ 97-82532

(51) Int. Cl.[7] ...................................................... G05F 1/10
(52) U.S. Cl. ............................................ 327/535; 327/537
(58) Field of Search .................................. 327/534–537, 327/541, 543, 546, 146–150, 155–159; 331/57

(56) References Cited

U.S. PATENT DOCUMENTS

| 5,043,677 | 8/1991 | Tomassetti et al. ...................... 331/2 |
| 5,262,989 | 11/1993 | Lee et al. ........................... 365/189.01 |
| 5,304,859 | * 4/1994 | Arimoto ................................... 327/535 |
| 5,315,557 | 5/1994 | Kim et al. ............................... 365/222 |
| 5,440,277 | 8/1995 | Ewen et al. ............................ 331/176 |
| 5,561,385 | * 10/1996 | Choi ...................................... 327/536 |
| 5,602,506 | * 2/1997 | Kim et al. .............................. 327/535 |
| 5,714,912 | 2/1998 | Fiedler et al. ........................... 331/57 |
| 5,808,505 | * 9/1998 | Tsukada ................................ 327/535 |
| 5,838,189 | * 11/1998 | Jeon ...................................... 327/537 |
| 5,907,257 | * 5/1999 | Liu et al. ............................... 327/535 |
| 5,920,226 | * 7/1999 | Mimura ................................. 327/537 |
| 5,952,872 | * 9/1999 | Hur ....................................... 327/535 |

* cited by examiner

Primary Examiner—My-Trang Nu Ton
(74) Attorney, Agent, or Firm—Oliff & Berridge, PLC

(57) ABSTRACT

The voltage control generator for a semiconductor device is disclosed, in which the substrate bias voltage through the oscillation period of the step-up voltage generator circuit are quickly adjusted with respect to the level variation of a corresponding voltage. The circuit according to the present invention includes a control level generator generating at least one control signal for detecting a substrate bias voltage level from a substrate of a semiconductor device and adjusting the width of an oscillation period to a set level in accordance with the detected signal, a voltage control oscillator generating a signal in which the width of an oscillation period is varied to the set level in response to an output signal from the control level generator, and a charge pump supplying a stable bias voltage to the substrate of the semiconductor device by increasing or decreasing a pumping speed in response to an output signal from the voltage control oscillator. Since the voltage control oscillator is used as an oscillator for determining the pumping period of the charge pump, it is possible to effectively control the oscillation period in accordance with the detected voltage level variation for thereby decreasing the power consumption.

16 Claims, 6 Drawing Sheets

VOLTAGE CONTROLLED GENERATOR FOR SEMICONDUCTOR DEVICES

BACKGROUND OF THE INVENTION

1. Field of the Invention

The present invention relates to a semiconductor device, and in particular, to a voltage controlled generator for a semiconductor device which makes it possible to actively control the pumping period of a bias voltage supplied to a semiconductor device using a voltage controlled oscillator.

2. Description of the Conventional Art

Recently, the semiconductor circuit is designed to have a characteristic that a substrate bias voltage is changed from a ground voltage GND to a negative bias voltage for thereby supplying a VBB voltage for the reason that the VBB voltage decreases a substrate bias effect and a junction electrostatic capacity of a threshold voltage, increases a punch through voltage and prevents a data damage due to undershoot.

The conventional substrate bias voltage (VBB) generation circuit is formed of a detector detecting a substrate bias voltage, a ring oscillator formed of an odd number of inverters and a charge pump. In the conventional circuit, when a VBB level is detected by the VBB detector, the ring oscillator is operated at a predetermined oscillation period, so that the VBB voltage generated based on the charge pump is supplied to the semiconductor substrate.

The thusly constituted VBB generation circuit should stably generate a substrate bias voltage level and a large Icp current based on a low electric power.

However, in the conventional VBB generation circuit, since a ring oscillator is operated at a constant oscillation period, if a substrate bias voltage variation occurs, the VBB voltage level of the charge pump does not quickly reach the substrate bias voltage, so that the efficiency of the charge pump is decreased, and the power consumption is increased.

In addition, the conventional step-up voltage generation circuit has a characteristic that a high voltage pulse higher than an external power voltage Vcc is applied to a semiconductor device for thereby compensating the threshold voltage loss of the transistor. The above-described conventional step-up voltage generation circuit is formed of a detector detecting the level of a step-up voltage VPP, a ring oscillator, and a charge pump. The step-up voltage generation circuit detects the VPP voltage level by the detector like the substrate bias voltage generation circuit and opens/closes the ring oscillator for thereby determining the operation of the charge pump.

Therefore, when the step-up voltage generation circuit is formed of a ring oscillator as a frequency oscillation device, since the signal period of the oscillator is constant, it is impossible to implement a fast pump speed of the charge pump when the level of the step-up voltage is decreased below a reference level for thereby decreasing the efficiency of the charge pump and increasing the power consumption.

SUMMARY OF THE INVENTION

Accordingly, it is an object of the present invention to provide a voltage controlled generator for a semiconductor device which overcomes the aforementioned problems encountered in the conventional art.

It is another object of the present invention to provide a voltage controlled generator for a semiconductor device which is capable of supplying a stable substrate bias voltage by extending the period of a voltage controlled oscillator when a substrate bias voltage level exceeds a predetermined level VPP by which it is possible to overcome the problem that an oscillation period of a VBB voltage generation circuit is not quickly controlled for a predetermined time against the level variation of a substrate bias voltage for thereby rapidly pumping a charge pump and is capable of decreasing or stopping a pumping operation by decreasing the period of a voltage controlled oscillator when the substrate bias voltage level drops below a VPP level.

It is another object of the present invention to provide a voltage controlled generator for a semiconductor device which is capable of supplying a stable step-up voltage by extending or shortening the oscillating period of a voltage controlled oscillator when a substrate bias voltage level exceeds or drops below a predetermined level VBB by which it is possible to overcome the problem that an oscillation period of a VBB voltage generation circuit is not quickly controlled for a predetermined time against the level variation of a step-up voltage.

In order to achieve the above objects, there is provided a voltage controlled generator for a semiconductor device according to a first embodiment of the present invention which includes a control level generator generating at least one control signal for detecting a substrate bias voltage level from a substrate of a semiconductor device and adjusting the width of an oscillation period to a set level in accordance with the detected signal, a voltage control oscillator generating a signal in which the width of an oscillation period is varied to the set level in response to an output signal from the control level generator, and a charge pump supplying a stable bias voltage to the substrate of the semiconductor device by increasing or decreasing a pumping speed in response to an output signal from the voltage control oscillator.

In order to achieve the above objects, there is provided a voltage controlled generator for a semiconductor device according to a second embodiment of the present invention which includes a control level generator generating at least one control signal for detecting a voltage level from a semiconductor device using a step-up voltage and adjusting the width of an oscillation period to a set level in accordance with the detected signal, a voltage control oscillator generating a signal in which the width of an oscillation period is varied to the set level in response to an output signal from the control level generator, and a charge pump supplying a stable step-up voltage to the semiconductor device by increasing or decreasing a pumping speed in response to an output signal from the voltage control oscillator.

Preferably, a control level generator includes a pull down control level generator generating a pull down voltage which is in inverse proportional to the voltage detected in a substrate of a semiconductor device.

More preferably, the control level generator includes a pull up control level generator generating a pull up voltage which is in inverse proportion to the voltage level detected in a substrate of the semiconductor device.

In the substrate bias circuit according to the present invention, it is possible to decrease a power consumption by controlling the period of a VBB pumping and to decrease a layout area by simplifying the circuit.

Preferably, a control level generator includes a pull up control level generator generating a pull up voltage which is in proportion to the voltage level detected in a semiconductor device requiring a step-up voltage or a pull down control level generator generating a pull down voltage which is in inverse proportion to the voltage level detected in a semiconductor device requiring a step-up voltage.

Therefore, in the step-up voltage generation circuit according to the present invention, it is possible to decrease the power consumption by actively controlling the pumping period of a charge pump in accordance with a VPP level variation and to decrease the layout area by simplifying the circuit.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims as a result of the experiment compared to the conventional arts.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The embodiments of the present invention will be explained with reference to the accompanying drawings.

Figure 1:
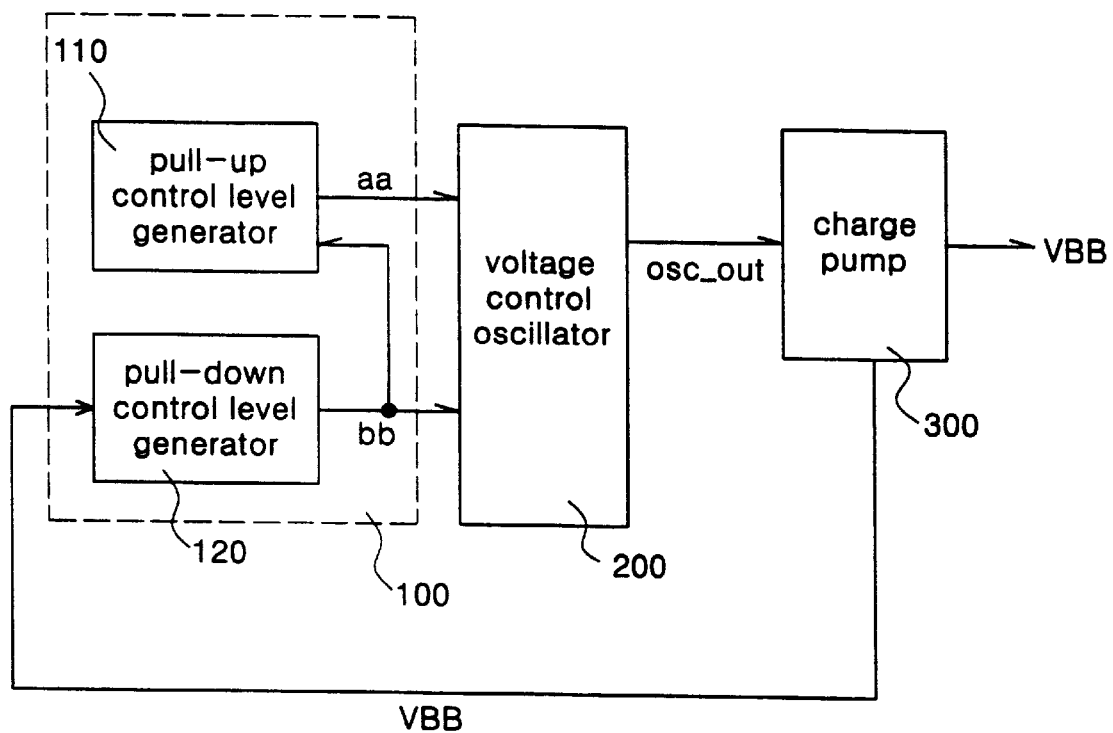
FIG. 1 is a block diagram illustrating a substrate bias voltage generation circuit for a semiconductor device controlling a pumping period using a voltage controlled oscillator according to the present invention.

FIG. 1 illustrates a substrate bias voltage generation circuit for a semiconductor device adjusting the pumping period using a voltage controlled oscillator according to the present invention.

As shown therein, the substrate bias voltage generation circuit according to the present invention includes a control level generator 100 generating a pull down control voltage "bb" and a pull up control voltage "aa" as at least one control signal for detecting a substrate bias voltage (VBB) level from a substrate of a semiconductor device and adjusting the width of an oscillation period to a set level, a voltage control oscillator 200 generating a clock signal osc_out having its width of an oscillation period which varies up to a set level in response to an output signal from the control level generator 100, and a charge pump 300 supplying a stable bias voltage VBB to the substrate of the semiconductor device by increasing or decreasing the pumping speed in response to an output signal from the voltage control oscillator 200

The control voltage generator 100 of the substrate bias voltage generation circuit according to the present invention includes a pull down control level generator 120 for generating a control voltage "bb" controlling a switching operation of the pull down device of the voltage control oscillator 200, and a pull up control level generator 110 for generating a control voltage "aa" controlling a switching operation of the pull up device.

Figure 2:
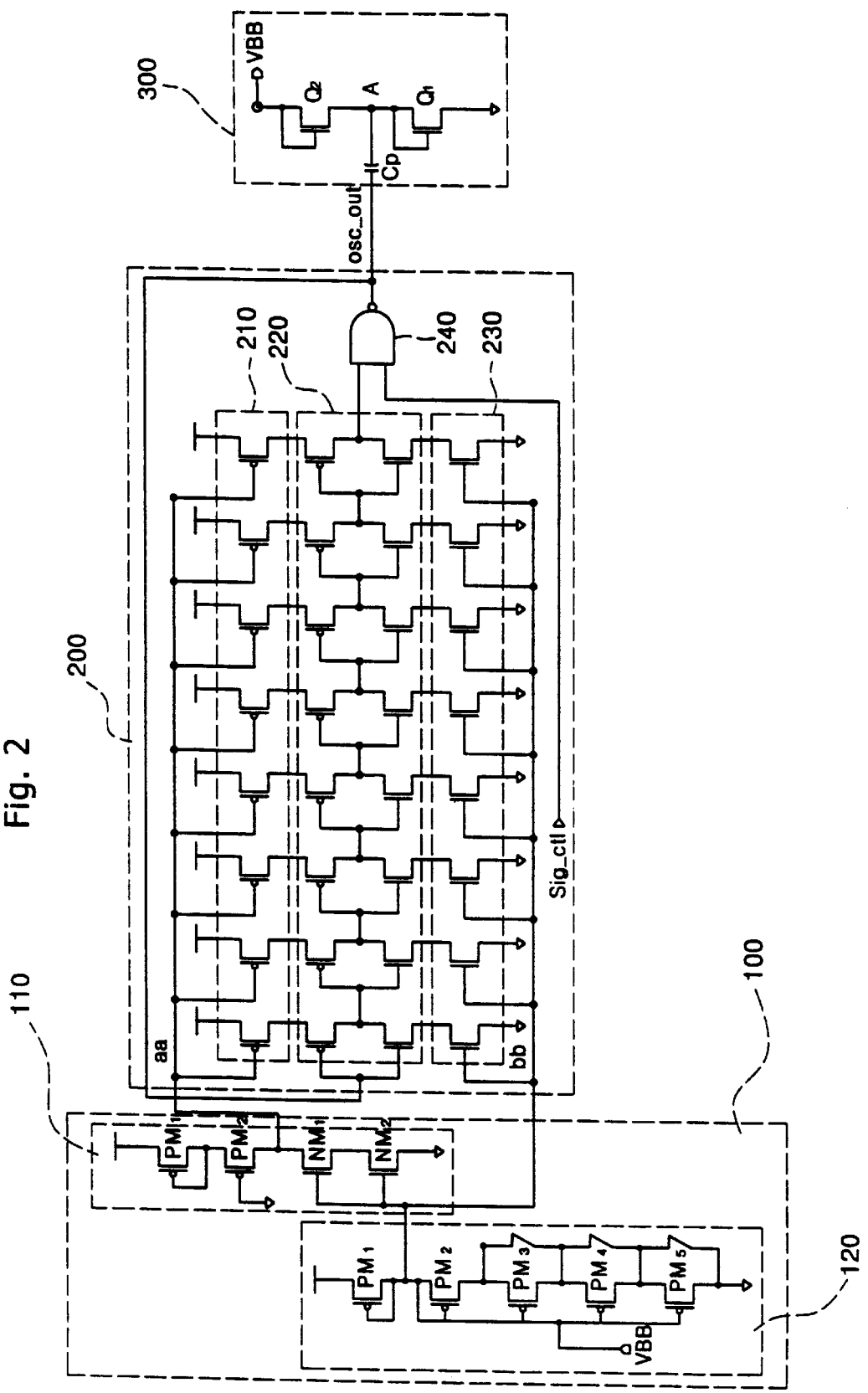
FIG. 2 is a detailed circuit diagram illustrating the circuit of FIG. 1.

FIG. 2 illustrates the detailed circuit of FIG. 1. As shown therein, the pull down control level generator 120 of the control voltage generator 100 includes a first PMOS transistor PM1 connected in series with a power voltage and having its commonly connected gate and drain, and second through fifth PMOS transistors PM2 through PM5 driven by the substrate bias voltage VBB and connected between the first PMOS transistor PM1 and a ground circuit. Here, the second PMOS transistor has its commonly connected gate and source, and the third and fifth PMOS transistors PM3 through PM5 have an option function capable of adjusting the period of the control voltage oscillator 200.

In addition, the pull up control level generator 110 includes sixth and seventh PMOS transistors PM6 and PM7 connected in series with a power voltage, and first and second NMOS transistors NM1 and NM2 connected between the transistors and the ground circuit and switched with a pull up control voltage "bb" from the nodes from the first and second PMOS transistors PM1 and PM2 of the pull down control level generator 120. Here, the sixth PMOS transistor PM6 has its commonly connected gate and drain, and a ground voltage is applied to the gate of the seventh PMOS transistor PM7.

The control voltage oscillator 200 includes a first switch string 210 formed of a plurality of PMOS transistors switched with a pull up control voltage "aa" from the connection nodes of the seventh PMOS transistor PM7 and the first NMOS transistor NM1 of the pull up control level generator 110 for thereby applying a power voltage, a second switch string 230 formed of a plurality of NMOS transistors switched with a pull down control voltage "bb" of the pull down control level generator 120 and applying a ground voltage, an inverter chain 220 connected in series with each transistor between the switch strings 210 and 230 and formed of a plurality of inverters outputting inverted signals in response to the feed-back output signal osc_out, and a logic gate 240 NANDing an output signal from the inverter chain 220 and an externally inputted enable signal sig_ctl and generating a clock signal osc_out.

The charge pump 300 includes a capacitor Cp charging a clock signal osc_out from the voltage control oscillator 200, a NMOS transistor Q1 connected between the capacitor Cp and the ground circuit, and a NMOS transistor Q2 connected with the node A connected with the capacitor Cp and the transistor Q1 and outputting a substrate bias voltage VBB. Here, the NMOS transistors Q1 and Q2 each have its commonly connected gate and drain.

Figure 3:
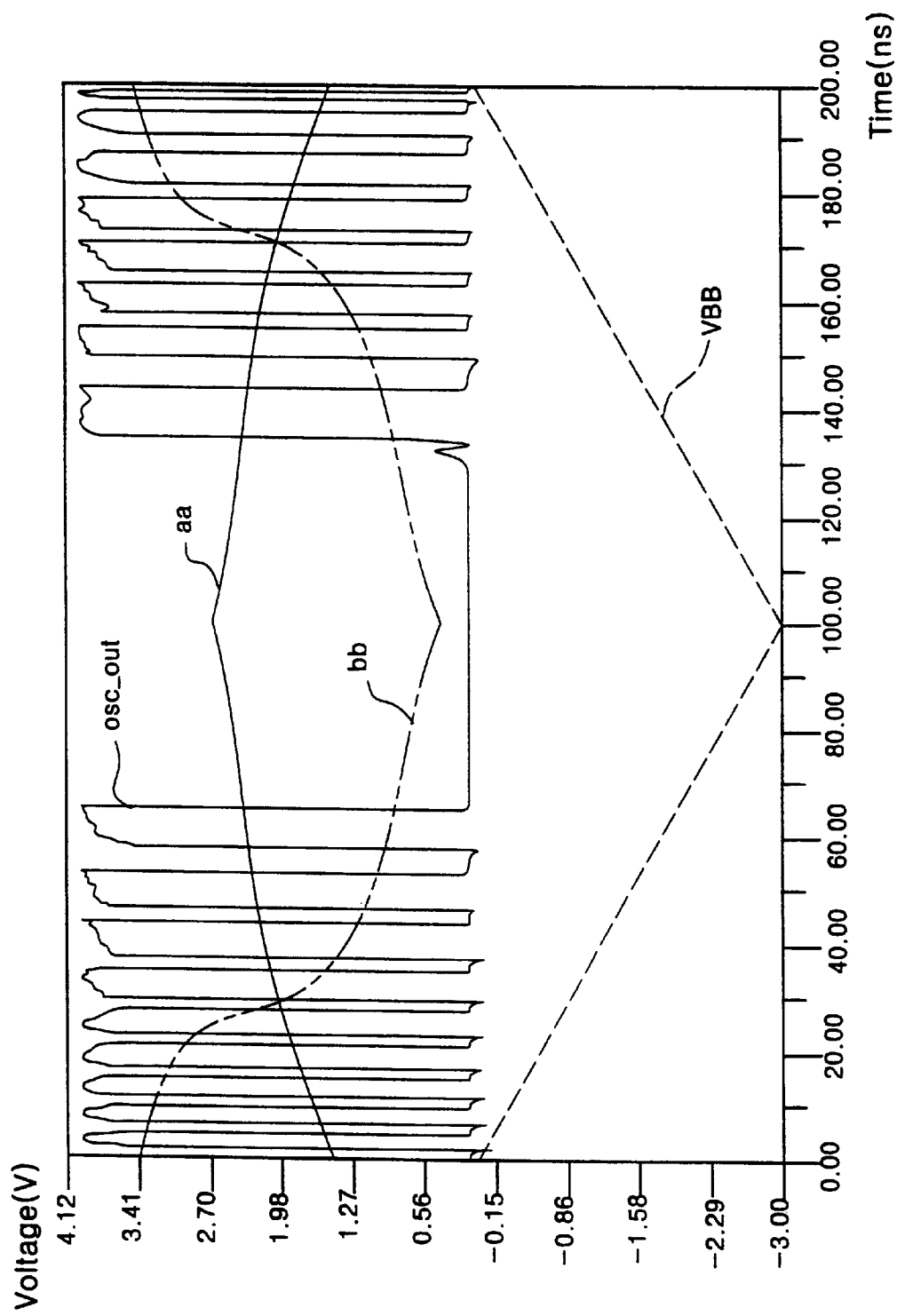
FIG. 3 is a simulation graph obtained by measuring an oscillation period by varying a VBB level in the circuit as shown in FIG. 2.

FIG. 3 illustrates a simulation graph obtained by measuring an oscillation period by varying the VBB level in the circuit of FIG. 2.

The operation of the substrate bias generation circuit according to the present invention will be explained with reference to FIGS. 2 and 3.

At an initial stage, the voltage of the node A of the charge pump 300 and the substrate bias voltage VBB are set to oV. However, if the VBB becomes a low level voltage due to an unstable system, the output "aa" of the pull up control level generator 110 of the control level generator 100 increases the voltage level so that the turn-on time of the PMOS transistor of the first switch string 210 of the voltage control oscillator 200 is maintained for a long time, and the output "bb" of the pull down control level generator 120 decreases the voltage level so that the turn-on time of the NMOS transistor of the second switch string 230 of the voltage control generator is maintained for a short time.

As a result, in the substrate bias voltage generation circuit according to the present invention, the clock period osc_out of the voltage control oscillator 200 is extended for thereby delaying the pumping operation or the pumping operation of the same is stopped at over the reference voltage level (here, about −3V), so that the bias voltage VBB level is controlled not to be lowered. In other words, when the voltage is decreased to the negative voltage level, the VBB supply from the node A through the Q2 of the charge pump 300 is decreased or stopped.

Next, if the substrate bias voltage is increased to a undesired level due to an external condition or a system error and the VBB level is increased from −3V to a predetermined level, the pull up control level generator 110 decreases the pull up control level "aa" for thereby decreasing the turn-on time of the transistor in the first switch string 210 of the voltage control oscillator 200, and the pull down control level generator 120 increases the pull down control level "bb" so that the turn-on time of the NMOS transistor in the second switch string 230 of the voltage control oscillator 200 is maintained for a long time.

In the voltage control generator 200, the clock period osc_out is gradually decreased, and the pumping speed of the charge pump 300 is increased, so that a desired substrate bias voltage VBB level is maintained. If the VBB is increased above a desired voltage level, the period of the voltage control oscillator 200 is decreased again, and the VBB level is quickly dropped for thereby decreasing the power consumption.

Therefore, in the substrate bias voltage generation circuit according to the present invention, it is possible to supply a uniform substrate bias voltage, so that it is possible to improve the problems such as a data loss or a latch-up problem.

The step-up voltage generation circuit according to the present invention will be explained with reference to FIGS. 4 through 7.

Figure 4:
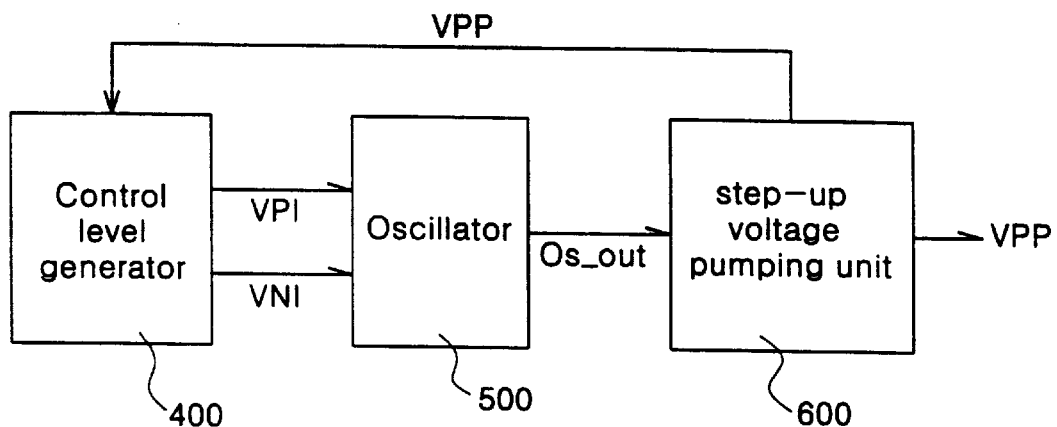
FIG. 4 is a block diagram illustrating a step-up voltage generation circuit for a semiconductor device adjusting the pumping period using a voltage controlled oscillator according to the present invention.

FIG. 4 is a block diagram illustrating a step-up voltage generation circuit for a semiconductor device adjusting the pumping period using a voltage controlled oscillator. As shown therein, the step-up voltage generation circuit for a semiconductor device according to the present invention includes a control level generator 400 generating a pull down control voltage VNI through a pull up control voltage VPI as at least one control signal for detecting a step-up voltage VPP level from the semiconductor device which requires the step-up voltage and adjusting the width of the oscillation period to a set level in accordance with the thusly detected signal, a voltage control oscillator 500 generating a clock signal Os_out having an oscillation period with its width varying to the set level in response to the output from the control level generator 400, and a charge pump 600 supplying a stable step-up voltage VPP to the semiconductor device by increasing or decreasing the pumping speed in response to the output Os_out from the voltage control oscillator 500.

The control level generator 400 detects the step-up voltage VPP level from the charge pump 600 and varies the oscillation period of the voltage control oscillator 500 for thereby generating pull up and pull down control voltages VPI and VNI having different level variations for varying the oscillation period of the voltage control oscillator 500.

The voltage control oscillator 500 generates the clock signal Os_out having its oscillation period varying in response to the voltages VPI and VNI from the control level generator 400.

Figure 5:
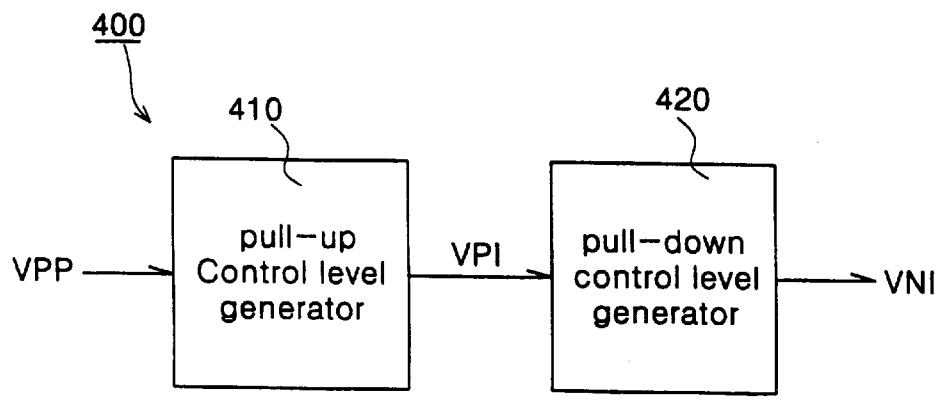
FIG. 5 is a block diagram illustrating a control level generator of the step-up voltage generation circuit as shown in FIG. 4.

FIG. 5 illustrates the control level generator of the step-up voltage generator as shown in FIG. 4. In the step-up voltage generator circuit according to the present invention, the control level generator 400 includes a pull up control level generator 410 and a pull down control level generator 420. Preferably, one selected between the pull up control level generator 410 and the pull down control level generator may be used.

Figure 6:
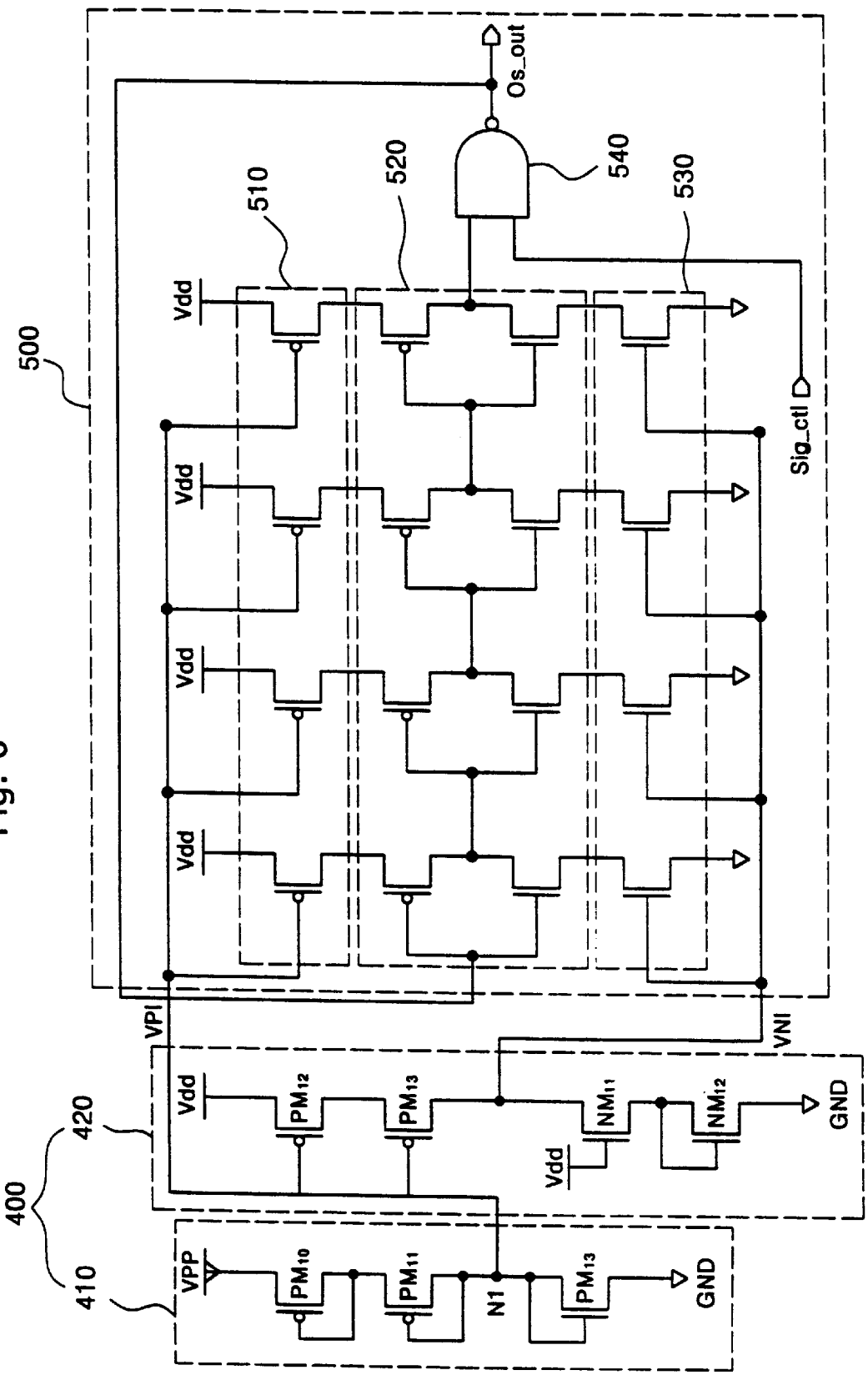
FIG. 6 is a circuit diagram illustrating the control level generator and a voltage controlled oscillator of FIG. 4.

The pull up control level generator 410 adapted in the present invention generates the pull up voltage VPI proportional to the step-up voltage VPP level by detecting the step-up voltage VPP level, and the pull down control level generator 420 generates the pull down voltage VNI which is in inverse proportion to the step-up voltage VPP level by detecting the step-up voltage VPP level FIG. 6 illustrates the detailed construction of the control level generator and the voltage control oscillator as shown in FIG. 4. As shown therein, the pull up control level generator 410 of the control level generator 400 includes first and second PMOS transistors PM10 and PM11 and a first NMOS transistor NM10 connected in series between the step-up voltage VPP and the ground voltage GND. Here, the pull up control voltage VPI is outputted from the node N1 connected with the second PMOS transistor PM11 and the first NMOS transistor NM10.

At this time, the transistors PM10, PM11 and NM10 are commonly connected with the gate and drain, respectively.

In addition, The pull down control level generator 420 of the control level generator 400 is connected in series between the power voltage Vdd and the ground voltage GND, includes third and fourth PMOS transistors PM12 and PM13 and second and third NMOS transistors NM11 and NM12, and generates a pull down control voltage VNI from the node N2 connected with the fourth PMOS transistor PM13 and the second NMOS transistor NM11. Here, the PMOS transistors PM12 and PM13 have a characteristic that the same are turned on by the control voltage VPI of the pull up control level generator 410, and the second NMOS transistor NM11 is turned on by the power voltage and is commonly connected with the gate and drain.

In addition, the control voltage oscillator 500 includes a first switch string 510 having a plurality of PMOS transistors switched by the pull up control voltage VPI from the node N1 of the pull up control level generator 410 and applying a power voltage Vdd, a second switch string 530 having a plurality of NMOS transistors switched by the pull down control voltage of the pull down control level generator 420 and applying the ground voltage, an inverter chain 520 having a plurality of inverters connected in series with each transistor between the switch strings 510 and 530 and outputting an inverted signal in response to the feed-back output signal Os_out, and a logic gate 540 NANDing an output signal from the inverter chain 520 and an externally inputted enable signal Sig_ctl for thereby generating a clock signal Os_out.

The charge pump according to the present invention as shown in FIG. 4 may be implemented by a known circuit or the circuit used for the substrate bias circuit.

Figure 7:
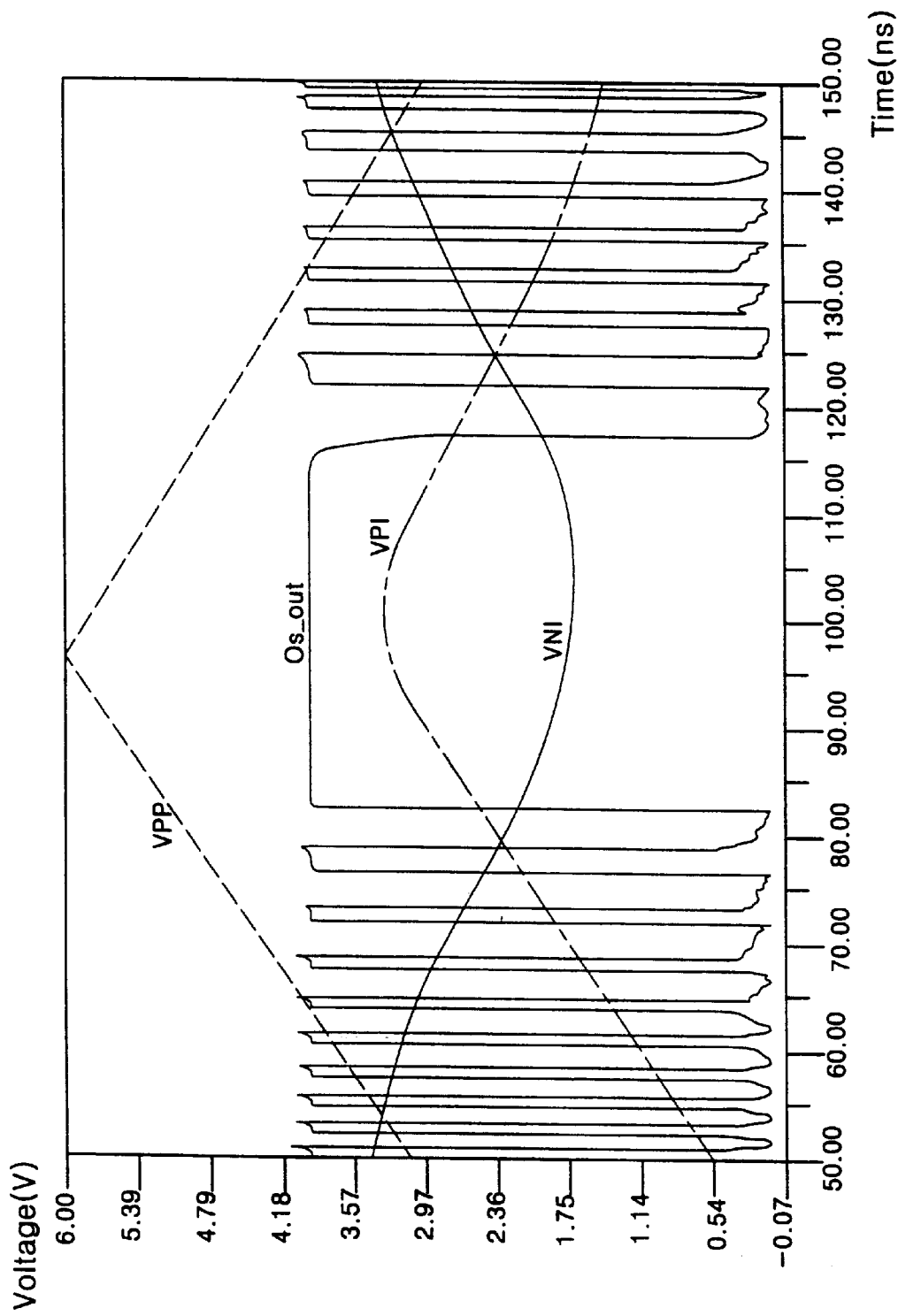
FIG. 7 is a simulation graph obtained by measuring the oscillation period by varying the VPP level of the step-up voltage generation circuit of FIG. 4.

FIG. 7 illustrates a simulation graph obtained by varying the VPP level of the step-up voltage generation circuit and measuring the oscillation period. The pull up control voltage VPI is in proportion to the step-up voltage VPP, and the pull down control voltage VNI is in inverse proportion to the step-up voltage VPP. Therefore, it is known that the period of the clock signal Os_out is varied with respect to the step-up voltage and the pull down and pull up control voltages VNI and VPI.

The operation of the step-up voltage generation circuit according to the present invention will be explained with reference to FIGS. 6 and 7.

When the step-up voltage VPP level is increased due to an external condition or a unstable system, in the step-up voltage generation circuit according to the present invention, the control voltage VPI of the pull up control level generator 410 of the control level generator 400 increases the voltage level so that the turn-on time of the PMOS transistor of the first switch string 510 of the voltage control oscillator 500 is maintained for a long time, and the control voltage VNI of the pull down control level generator 420 of the control level generator 400 decreases the voltage level so that the turn-on time of the NMOS transistor of the second switch string 530 of the voltage control oscillator 500 is maintained for a short time. Namely, the level of the pull-up voltage VPI is in proportion to the variation of the step-up voltage VPP. When the level of the same becomes VPI+$\Delta\alpha$ increased by $\Delta\alpha$ than the earlier voltage level, the amount of current flowing through the first switch string 510 of the voltage control oscillator 500 should be limited. Therefore, the pull down voltage VNI has a VNI−$\Delta\beta$ voltage level which is decreased slightly than the earlier voltage level.

Hence, in the substrate bias voltage generation circuit according to the present invention, the period of the clock Os_out of the voltage control oscillator 500 is gradually increased for thereby slowing down the pumping operation of the charge pump or is stopped above the reference voltage level (about 6V), so that the step-up voltage VPP level of the semiconductor device is not increased.

On the other hand, when decreasing the substrate bias voltage to an undesired level due to an external condition and system error or decreasing the step-up voltage VPP level to a set voltage level set below 6V, the pull up control level generator 410 decreases the control voltage VPI so that the turn-on time of the PMOS transistor of the first switch string 510 of the voltage control oscillator 500 is maintained for a short time, and the control level generator 420 increases the pull down control voltage VNI so that the turn-on time of the NMOS transistor of the second switch string 530 of the voltage control oscillator 500 is maintained for a long time.

Therefore, the period of the clock Os_out of the voltage control oscillator 500 is gradually decreased for thereby implementing a fast pumping operation of the charge pump, so that the voltage control generator 500 maintains a step-up voltage VPP level. If the VPP is lowered below the desired voltage level, the period of the voltage control oscillator 500 is extended, and the power consumption is decreased by quickly decreasing the VPP level.

In the present invention, the period of the clock signal which determines the pumping period of the charge pump is automatically varied in accordance with the step-up voltage. In addition, the pumping efficiency of the step-up voltage is enhanced, so that a more stable step-up voltage level is supplied to the semiconductor circuit.

In the control voltage generator according to the present invention, one between the pull up control level generator and the pull down control level generator may be used.

The enable signal Sig_ctl used in the voltage control generator is used for receiving a power voltage when a corresponding circuit is operated and maintaining a uniform of the signal, and a double level signal or a signal based on a multiple leveL detection may be used.

As described above, in the voltage control generator according to the present invention, the oscillator operating the charge pump is used as a voltage control oscillator which is quickly responded to the variation of the substrate bias voltage/step-up voltage instead of the ring oscillator, so that it is possible to increase the efficiency of the charge pump and decrease the power consumption of the circuit. In addition, the construction of the detection circuit and the delay circuit may be simplified, and the area of the layout may be decreased.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A voltage control generator for a semiconductor device, comprising:

a control level generator that detects a substrate bias voltage level from a substrate of the semiconductor device and outputs one of a first control voltage and a second control voltage in accordance with the detected substrate bias voltage level;

a voltage control oscillator that generates a signal in which the width of an oscillation period is varied to a set level in response to said one of the first control voltage and the second control voltage; and a charge pump that supplies a stable bias voltage to the substrate of the semiconductor device by increasing or decreasing a pumping speed in response to the signal from the voltage control oscillator.

2. The generator of claim 1, wherein said control level generator includes a pull down control level generator that generates the first control voltage, the first control voltage being a pull down voltage which is in proportion to the substrate bias voltage level detected from the substrate of the semiconductor device.

3. The generator of claim 2, wherein said pull down control level generator includes more than two transistors connected between a power voltage and a ground circuit.

4. The generator of claim 1, further comprising a pull up control level generator that generates the second control voltage, the second control voltage being a pull up voltage which is in inverse proportion to the substrate bias voltage level detected from the substrate of the semiconductor device.

5. The generator of claim 4, wherein said pull up control level generator includes at least two transistors connected between the power voltage and the ground circuit.

6. The generator of claim 1, wherein the voltage control oscillator includes a first switch string that responds to the first control voltage, a second switch string that responds to the second control voltage, an inverter chain having a plurality of inverters connected in series between the first and second switch strings and outputting an inverted signal in response to a feedback output signal, and a logic gate that generates an output signal by NANDing the output signal from the inverter chain and an externally inputted enable signal.

7. The generator of claim 6, wherein
   the first switch string has a plurality of transistors switched in response to the first control voltage and applies a power voltage so that a current flow which is in proportion to the first control voltage and which is in inverse proportion to the second control voltage is implemented; and the second switch string has a plurality of transistors switched in response to the second control voltage and applies a ground voltage.

8. The generator of claim 7, wherein said first and second switch strings and inverter chain each include an even number of transistors and an inverter.

9. A voltage control generator for a semiconductor device, comprising:

a control level generator that detects a voltage level from the semiconductor device using a step-up voltage and outputs one of a first control voltage and a second control voltage in accordance with the detected voltage level;

a voltage control oscillator that generates a signal in which the width of an oscillation period is varied to a set level in response to said one of the first control voltage and the second control voltage from the control level generator; and a charge pump that supplies a stable step-up voltage to the semiconductor device by increasing or decreasing a pumping speed in response to the signal from the voltage control oscillator.

10. The generator of claim 9, wherein said control level generator includes a pull up control level generator that generates the first control voltage, the first control voltage being a pull up voltage which is in proportion to the voltage level detected from the semiconductor device requiring the step-up voltage.

11. The generator of claim 10, wherein said pull up control level generator includes more than two transistors connected between a power voltage and a ground circuit.

12. The generator of claim 10, wherein said control level further includes a pull down control level generator that generates the second control voltage, the second control voltage being a pull down voltage which is in inverse proportion to the voltage level detected from the semiconductor device requiring the step-up voltage.

13. The generator of claim 12, wherein said pull down control level generator includes at least two transistors connected between the power voltage and the ground circuit.

14. The generator of claim 9, wherein the voltage control oscillator includes a first switch string that responds to the first control voltage, a second switch string that responds to the second control voltage, an inverter chain having a plurality of inverters connected in series between the first and second switch strings and outputting an inverted signal in response to a feedback output signal, and a logic gate that generates an output signal by NANDing the output signal from the inverter chain and an externally inputted enable signal.

15. The generator of claim 14, wherein oscillator includes:

the first switch string has a plurality of transistors switched in response to the first control voltage and applies a power voltage so that a current flow which is in inverse proportion to the first control voltage and which is in proportion to the second control voltage is implemented; and the second switch string has a plurality of transistors switched in response to the second control voltage and applies a ground voltage.

16. The generator of claim 15, wherein said first and second switch strings and inverter chain each include an even number of transistors and even number of inverters.

* * * * *